(12) United States Patent
Hong

(10) Patent No.: US 9,178,002 B2
(45) Date of Patent: Nov. 3, 2015

(54) ORGANIC LIGHT-EMITTING DIODE (OLED) DISPLAY

(71) Applicant: Samsung Display Co., Ltd., Yongin, Gyeonggi-Do (KR)

(72) Inventor: Sang Min Hong, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/268,893

(22) Filed: May 2, 2014

(65) Prior Publication Data

US 2015/0102299 A1 Apr. 16, 2015

(30) Foreign Application Priority Data

Oct. 14, 2013 (KR) .................. 10-2013-0122079

(51) Int. Cl.
*H01L 51/52* (2006.01)
*H01L 27/32* (2006.01)

(52) U.S. Cl.
CPC ........ *H01L 27/3258* (2013.01); *H01L 27/3246* (2013.01); *H01L 51/5246* (2013.01)

(58) Field of Classification Search
CPC .................. H01L 2251/5315; H01L 27/124; H01L 27/3276; H01L 51/5234
See application file for complete search history.

(56) References Cited

U.S. PATENT DOCUMENTS

| 2005/0046346 | A1* | 3/2005 | Tsuchiya et al. ............... 313/509 |
| 2010/0246152 | A1* | 9/2010 | Lin et al. ......................... 361/783 |
| 2010/0253710 | A1* | 10/2010 | Rankov et al. ................. 345/690 |
| 2011/0134094 | A1 | 6/2011 | Nathan et al. |
| 2011/0221720 | A1 | 9/2011 | Kuo et al. |
| 2012/0104420 | A1* | 5/2012 | Lee et al. ......................... 257/88 |

FOREIGN PATENT DOCUMENTS

| KR | 10-2006-0078574 A | 7/2006 |
| KR | 10-2011-0102251 A | 9/2011 |

* cited by examiner

*Primary Examiner* — Khaja Ahmad
(74) *Attorney, Agent, or Firm* — Knobbe, Martens, Olson & Bear, LLP

(57) ABSTRACT

An organic light-emitting diode (OLED) display is disclosed. In one aspect, the OLED display includes a display substrate including a display area displaying an image and a peripheral area surrounding the display area. The OLED display also includes an encapsulation substrate facing the display substrate and a sealant bonding the display substrate to the encapsulation substrate. The display substrate includes a substrate, a scan driver formed over the substrate in the peripheral area and including a common voltage line applying a common voltage to the display area. The display substrate also includes a pixel defining layer formed above the common voltage line. The sealant is formed over the scan driver and contacts an upper surface of the pixel defining layer.

17 Claims, 5 Drawing Sheets

ORGANIC LIGHT-EMITTING DIODE (OLED) DISPLAY

CROSS-REFERENCE TO RELATED APPLICATIONS

This application claims priority to and the benefit of Korean Patent Application No. 10-2013-0122079 filed in the Korean Intellectual Property Office on Oct. 14, 2013, the entire contents of which are incorporated herein by reference.

BACKGROUND

1. Field

The described technology generally relates to an organic light-emitting diode (OLED) display.

2. Description of the Related Technology

Organic light-emitting diode (OLED) displays include a display substrate having a display area that can display an image and a peripheral area surrounding the display area which contains driving circuitry. OLED displays also include an encapsulation substrate formed over the display substrate to seal the display area.

The display area of the standard OLED display includes a number of pixels arranged in a matrix and connected to scan and data lines. Each pixel includes an OLED which includes an anode, a cathode, and an organic emission layer interposed therebetween. The standard OLED display also includes scan and data lines extending into the display area, a common voltage line, and scan and data drivers that process signals received from an external source and apply the processed signals to these lines.

A sealant can be used to bond the display substrate to the encapsulation substrate. The sealant is typically formed on the scan driver circuitry in the peripheral area in order to reduce the overall width of the peripheral area. However, when the sealant is cured, heat produced in the curing process can cause defects in the wiring of the scan driver.

The above information disclosed in this Background section is only intended to facilitate the understanding of the background of the described technology and therefore it may contain information that does not constitute the prior art that is already known in this country to a person of ordinary skill in the art.

SUMMARY OF CERTAIN INVENTIVE ASPECTS

One inventive aspect is an organic light-emitting diode (OLED) display which can prevent defects due to excess heat when curing a sealant.

Another aspect is an OLED display, including a display substrate including a display area displaying an image and a peripheral area surrounding the display area, an encapsulation substrate facing the display substrate, and a sealant bonding the display substrate and the encapsulation substrate and disposed in the peripheral area, in which the display substrate includes a substrate, a driver disposed in the peripheral area on the substrate and including a common voltage line applying a common voltage to the display area, and a pixel defining layer disposed on the common voltage line, and the sealant is disposed on the driver and contacts an upper surface of the pixel defining layer.

The display substrate may further include a driving semiconductor layer disposed in the display area on the substrate, a first gate insulating layer disposed on the driving semiconductor layer and in the peripheral area of the substrate, and a floating gate electrode disposed in the display area on the first gate insulating layer, the common voltage line may be disposed on the same layer as the floating electrode, and materials of the common voltage line and the floating gate electrode may be the same as each other.

The display substrate may further include a second gate insulating layer disposed on the floating gate electrode and the first gate insulating layer, a driving gate electrode disposed in the display area on the second gate insulating layer, and a common voltage connection line disposed in the peripheral area on the second gate insulating layer and connected with the common voltage line.

Materials of the common voltage connection line and the driving gate electrode may be the same as each other.

The display substrate may further include an interlayer insulating layer disposed on the driving gate electrode, the common voltage connection line, and the second gate insulating layer, a driving source electrode and a driving drain electrode disposed in the display area on the interlayer insulating layer, and a first common voltage applying electrode disposed in the peripheral area on the interlayer insulating layer and connected with the common voltage connection line.

A material of the first common voltage applying electrode may be the same as the materials of the driving source electrode and the driving drain electrode.

The display substrate may further include a passivation layer disposed on the driving source electrode, the driving drain electrode, and the first common voltage applying electrode, a first electrode disposed in the display area on the passivation layer and connected to the driving drain electrode, and a second common voltage applying electrode disposed in the peripheral area on the passivation layer and connected to the first common voltage applying electrode.

Materials of the second common voltage applying electrode and the first electrode may be the same as each other.

The passivation layer may be disposed up to a portion corresponding to the common voltage line of the peripheral area.

The pixel defining layer may be disposed on an edge of the first electrode and the passivation layer and expose a part of the first electrode, and the display substrate may further include an organic emission layer disposed on the exposed first electrode, and a second electrode disposed on the organic emission layer and the pixel defining layer.

The pixel defining layer may cover the passivation layer positioned in the peripheral area, and be disposed up onto the interlayer insulating layer positioned in the peripheral area.

The second electrode may be connected to the second common voltage applying electrode, and receive the common voltage.

The second gate insulating layer may include a common voltage connection hole exposing a part of the common voltage line, and the common voltage connection line may be connected with the common voltage line through the common voltage connection hole.

The interlayer insulating layer may include a first common voltage applying hole exposing a part of the common voltage connection line, and the first common voltage applying electrode may be connected to the common voltage connection line through the first common voltage applying hole.

The passivation layer may include a second common voltage applying hole exposing a part of the first common voltage applying electrode, and the second common voltage applying electrode may be connected to the first common voltage applying electrode through the second common voltage applying hole.

The pixel defining layer may include a third common voltage applying hole exposing a part of the second common voltage applying electrode, and the second electrode may be connected to the second common voltage applying electrode through the third common voltage applying hole.

The pixel defining layer may have a width greater than that of the common voltage line, wherein the width is measured in a direction substantially parallel with the display substrate.

According to at least one embodiment, a sealant for bonding a display substrate and an encapsulation substrate is disposed on a scan driver in a peripheral area, thereby reducing the width of the peripheral area.

Further, the sealant does not contact a common electrode, but instead contacts an upper surface of a pixel defining layer to prevent defects from occurring in the electrode due to heat applied during laser curing of the sealant.

DETAILED DESCRIPTION OF CERTAIN INVENTIVE EMBODIMENTS

Figure 1:
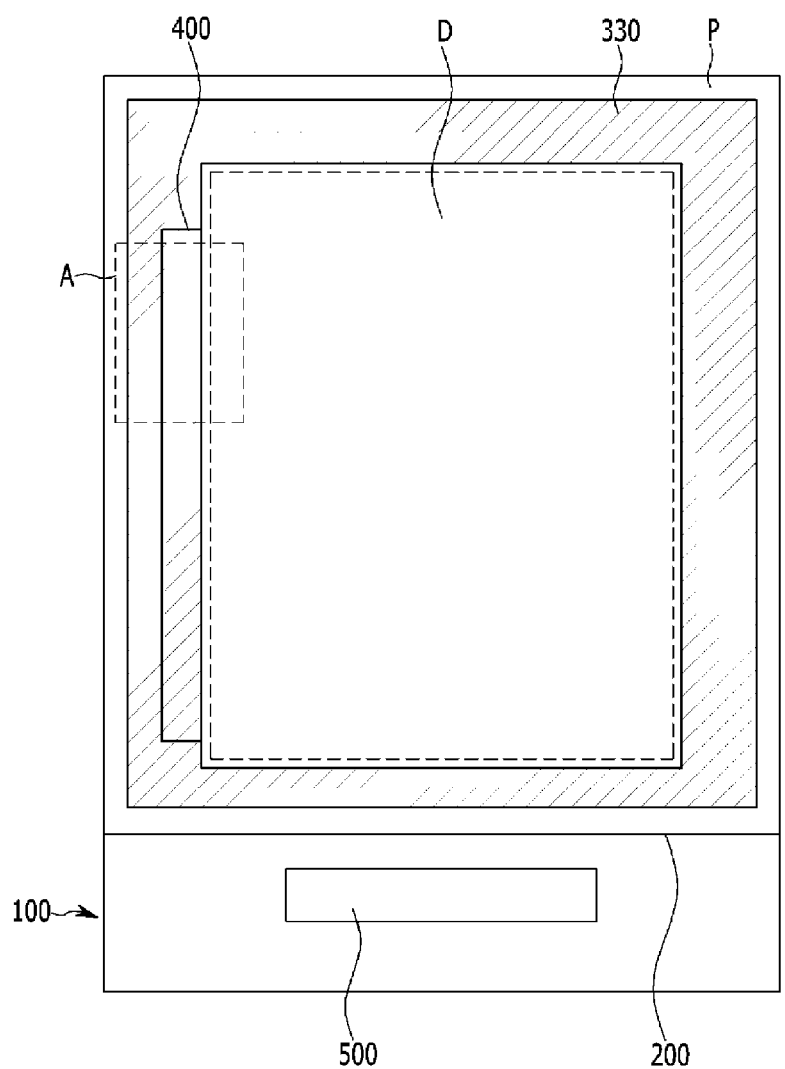
FIG. 1 is a plan view of a display area and a peripheral area of an OLED display according to an exemplary embodiment.

The display area of the standard OLED display includes a number of pixels arranged in a matrix and connected to scan and data lines. Each pixel includes an OLED which includes an anode, a cathode, and an organic emission layer interposed therebetween. The standard OLED display also includes scan and data lines extending into the display area, a common voltage line, and scan and data drivers that process signals received from an external source and apply the processed signals to these lines.

A sealant can be used to bond the display substrate to the encapsulation substrate. The sealant can be formed on the scan driver in the peripheral area in order to reduce the overall width of the peripheral area. However, when the sealant is cured, heat produced in the curing process can cause defects in the wiring of the scan driver.

Hereinafter, exemplary embodiments of the described technology will be described in detail with reference to the accompanying drawings. As those skilled in the art would realize, the described embodiments may be modified in various different ways, all without departing from the spirit or scope of the described technology. On the contrary, exemplary embodiments introduced herein are provided to thoroughly and completely disclose the described technology so as to sufficiently convey the spirit of the described technology to those skilled in the art.

Further, the size and thickness of each of the elements shown in the drawings may be exaggerated for understanding and ease of description, however, the described technology is not limited thereto.

In the drawings, the thicknesses of layers, films, panels, regions, etc., may be exaggerated for clarity. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements.

Further, throughout this specification, "on a plane" refers to viewing a specified portion from the top, and "on a cross section" refers to viewing a vertical cross section of the specified portion from the side.

Figure 2:
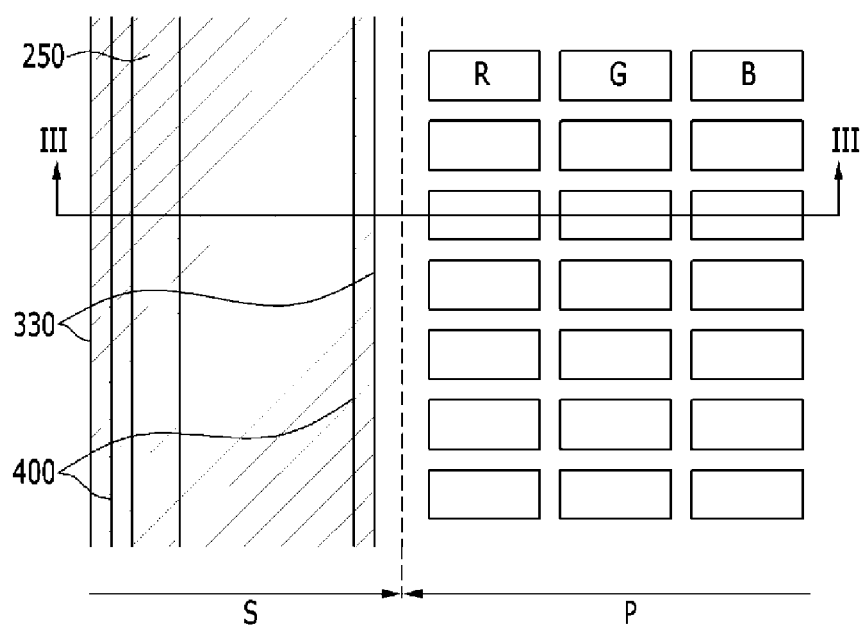
FIG. 2 is an enlarged plan view of a portion A of FIG. 1.
Figure 3:
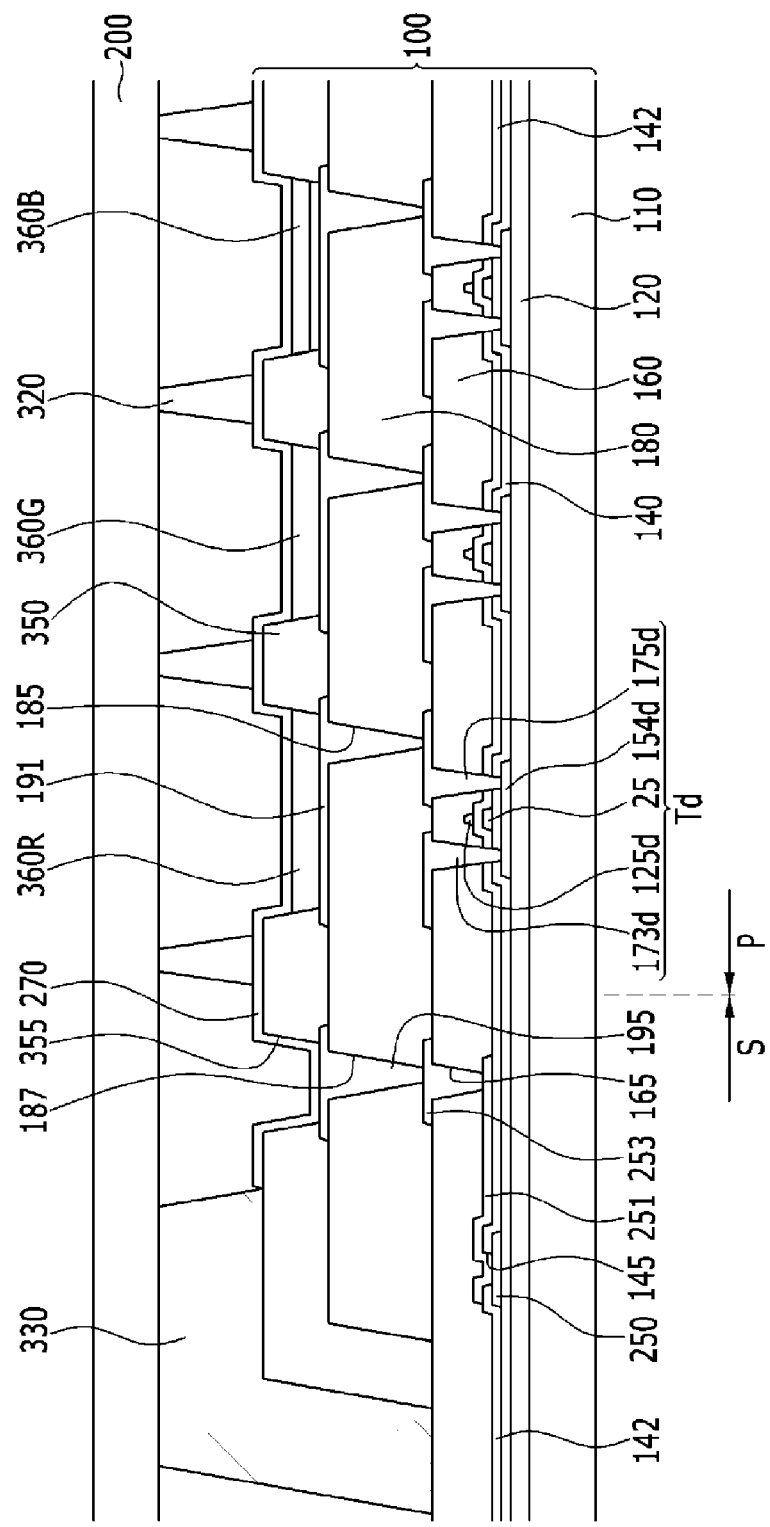
FIG. 3 is a cross-sectional view of FIG. 2 taken along line III-III.

Referring to FIGS. 1 to 3, an organic light-emitting diode (OLED) display includes a display substrate 100 and an encapsulation substrate 200 facing the display substrate 100.

The display substrate 100 includes a plurality of thin film layers formed on a substrate 110 made of transparent glass or plastic. The display substrate is divided into a display area D which can display an image and a peripheral area P surrounding the display area D.

A plurality of pixels including red pixels, blue pixels, and green pixels are formed in the display area D. Each pixel has an OLED including a first electrode 191, a second electrode 270, an organic emission layer 360R, 360G, or 360B interposed between the first and second electrodes 191 and 270. Each pixel also includes a driving thin film transistor Td connected to the OLED. Although not illustrated, the OLED display also includes a scan line and a data line connected to the driving thin film transistor Td.

A scan driver 400 and a data driver 500 are formed in the peripheral area P and the scan and data drivers 400 and 500 process signals received from an external source and respectively supply the processed signals to the scan line and the data line.

The scan and data drivers 400 and 500 convert the received signals into a scan signal and a data signal to selectively drive each pixel. The scan and data drivers 400 and 500 respectively include a driving circuit part including a plurality of peripheral thin film transistors Tc.

Further, a common voltage line 250 is formed in the scan driver 400 and the common voltage line 250 supplies a common voltage to the OLEDs included in the display area D.

Further, a sealant 330 is formed along the circumference of the display area D in the peripheral area P to bond the display substrate 100 and encapsulation substrate 200. The sealant 330 is formed over the scan driver 400. The sealant 330 includes frit glass or glass paste and substantially prevents moisture from penetrating into the display area D.

As such, the sealant 330 is formed over the scan driver 400 to thereby reduce the width of the peripheral area P.

Hereinafter, the structure of the OLED display according to an exemplary embodiment will be described in detail based on the laminating order thereof.

First, the display substrate 100 will be described.

A buffer layer 120 is formed on the substrate 110 and a driving semiconductor layer 154*d* is formed on the buffer layer 120 in the display area D. The driving semiconductor layer 154*d* includes a channel region, and source and drain regions which face each other with the channel region interposed therebetween.

A first gate insulating layer 140 is formed on the driving semiconductor layer 154*d* and the buffer layer 120.

A floating gate electrode 25 is formed on the first gate insulating layer 140 of the display area D. The floating gate electrode 25 overlaps the driving semiconductor layer 154*d* and is separated from the scan line. Here, the floating gate electrode 25 overlaps the channel region of the driving semiconductor layer 154*d*.

A common voltage line 250 is formed on the first gate insulating layer 140 in the peripheral area P. The common voltage line 250 and the floating gate electrode 25 may be formed of the same material.

A second gate insulating layer 142 is formed on the floating gate electrode 25, the common voltage line 250, and the first gate insulating layer 140.

A driving gate electrode 125*d* is formed on the second gate insulating layer 142 in the display area D. The driving gate electrode 125*d* is connected to the scan line and overlaps the floating gate electrode 25.

A common voltage connection line 251 is formed on the second gate insulating layer 142 in the peripheral area P. A common voltage connection hole 145 is formed in the second gate insulating layer 142 and exposes a portion of the common voltage line 250. The common voltage connection line 251 is connected to the common voltage line 250 through the common voltage connection hole 145. Here, the common voltage connection line 251 and the driving gate electrode 125*d* may be formed of the same material.

An interlayer insulating layer 160 is formed on the driving gate electrode 125*d*, the common voltage connection line 251, and the second gate insulating layer 142.

A driving source electrode 173*d* and a driving drain electrode 175*d* are formed on the interlayer insulating layer 160 in the display area D. A plurality of contact holes are formed in the interlayer insulating layer 160, the second gate insulating layer 142, and the first gate insulating layer 140 and expose portions of the driving semiconductor layer 154*d*. The driving source and drain electrodes 173*d* and 175*d* are connected to the driving semiconductor layer 154*d* through respective contact holes. The driving source electrode 173*d* is connected to the source region of the driving semiconductor layer 154*d* and the driving drain electrode 175*d* is connected to the drain region of the driving semiconductor layer 154*d*. Further, the driving source and drain electrodes 173*d* and 175*d* may be formed of the same material.

The driving semiconductor layer 154*d*, the floating gate electrode 25, the driving gate electrode 125*d*, the driving source electrode 173*d*, and the driving drain electrode 175*d* form a driving thin film transistor Td.

In the driving thin film transistor Td, since the driving gate electrode 125*d* is formed on the first gate insulating layer 140 and the second gate insulating layer 142, the distance between the driving gate electrode 125*d* and the driving semiconductor layer 154*d* is increased. Accordingly, the driving range of a gate voltage applied to the driving gate electrode 125*d* may be relatively widened, and thus, the gray scale of light emitted from the OLED can be more finely controlled. As a result, the resolution of the OLED display can be enhanced thereby improving the display quality.

A first common voltage applying electrode 253 is formed on the interlayer insulating layer 160 in the peripheral area P. A first common voltage applying hole 165 is formed in the interlayer insulating layer 160 in the peripheral area P and exposes a portion of the common voltage connection line 251. The first common voltage applying electrode 253 is connected to the common voltage connection line 251 through the first common voltage applying hole 165. The first common voltage applying electrode 253 may be formed of the same material as the driving source and drain electrodes 173*d* and 175*d*.

A passivation layer 180 is formed on the interlayer insulating layer 160 and covering the driving source electrode 173*d*, the driving drain electrode 175*d*, and the first common voltage applying electrode 253.

The passivation layer 180 is formed in an area corresponding to the common voltage line 250 in the peripheral area P, but is not formed farther outside the corresponding area.

A first electrode 191 is formed on the passivation layer 180 in the display area D. A contact hole 185 is formed in the passivation layer 180 in the display area D and exposes a portion of the driving drain electrode 175*d*. The first electrode 191 is connected to the driving drain electrode 175*d* through the contact hole 185.

A second common voltage applying electrode 195 is formed on the passivation layer 180 in the peripheral area P. A second common voltage applying hole 187 is formed in the passivation layer 180 in the peripheral area P and exposes a portion of the first common voltage applying electrode 253. The second common voltage applying electrode 195 is connected to the first common voltage applying electrode 253 through the second common voltage applying hole 187. The second common voltage applying electrode 195 and the first electrode 191 may be formed the same material.

A pixel defining layer 350 is formed on the passivation layer 180 and edges of the first electrode 191.

The first electrode 191 is exposed through openings defined in the pixel defining layer 350. One of the organic emission layers 360R, 360G, and 360B is formed on the exposed first electrode 191 of a respective pixel. A second electrode 270 is formed on the organic emission layers 360R, 360G, and 360B and the pixel defining layer 350.

The first electrode 191, one of the organic emission layers 360R, 360G, and 360B, and the second electrode 270 form each the OLED. In the embodiment of FIG. 3, the first electrode 191 is an anode which is a hole injection electrode and the second electrode 270 is a cathode which is an electron injection electrode. However, the described technology is not necessarily limited thereto. In other embodiments, the first electrode 191 is the cathode and the second electrode 270 is the anode based on the driving method of the embodiment. Holes and electrons from the first electrode 191 and the second electrode 270 are injected into the organic emission layers 360R, 360G, and 360B and excitons are formed when the injected holes and electrons are coupled with each other. When these excitons decay from an excited state to a ground state, light is emitted.

The organic emission layers 360R, 360G, and 360B may be made of low-molecular organic materials or high-molecular organic materials. Further, the organic emission layers 360R, 360G, and 360B may be formed as a multilayer including an emission layer, and one or more of a hole injection layer (HIL), a hole transporting layer (HTL), an electron transporting layer (ETL), and an electron injection layer (EIL). When the organic emission layers 360R, 360G, and 360B include all the layers, the hole injection layer (HIL) is formed on the first electrode 191 which is an anode, and the hole transporting layer (HTL), the emission layer, the electron transporting layer (ETL), and the electron injection layer (EIL) are sequentially laminated thereon. In some embodiments, the second electrode 270 is formed of a reflective conductive material forming a bottom emission type OLED display. The reflective material may include at least one material such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The pixel defining layer 350 covers the passivation layer 180 in the peripheral area P and extends to the interlayer insulating layer 160 in the peripheral area P.

A third common voltage applying hole 355 is formed in the pixel defining layer 350 in the peripheral area P and exposes a portion of the second common voltage applying electrode 195. The second electrode 270 is connected to the second common voltage applying electrode 195 through the third common voltage applying hole 355. As a result, a common voltage is applied to the second electrode 270.

The encapsulation substrate 200 is formed on the display substrate 100. A gap is maintained between the encapsulation substrate 200 and the display substrate 100 by a spacer 320.

The spacer 320 is formed on the second electrode in the display area D in an area corresponding to the pixel defining layer 350.

The sealant 330 bonds the display substrate 100 to the encapsulation substrate 200. The sealant 330 includes frit glass or glass paste to prevent moisture from penetrating into the display area D. The sealant 330 covers the pixel defining layer 350 in the peripheral area P and is formed on the interlayer insulating layer 160 in the peripheral area P. The sealant 330 contacts the upper surface of the pixel defining layer 350 in the peripheral area P.

Additionally, the sealant 330 does not contact the second electrode 270. In some embodiments, the sealant 330 is formed spaced apart from the second electrode 270. Accordingly, when a laser is irradiated onto the sealant 330 to cure the sealant 330, defects in the electrode due to heat can be substantially prevented.

The second electrode 270 is connected to the common voltage line 250 through the common voltage connection line 251, the first common voltage applying electrode 253, and the second common voltage applying electrode 195, and thus, does not contact the sealant 330.

Further, lines such as the common voltage connection line 251 and the common voltage line 250 are formed below the sealant 330. However, insulating layers including the interlayer insulating layer 160, the passivation layer 180, and the pixel defining layer 350 are formed between the lines and the sealant 330, and as a result, when the laser is irradiated onto the sealant 330, the effects of heat may be minimized.

Next, the scan driver 400 and the data driver 500 will be described in detail with reference to FIG. 4.

Figure 4:
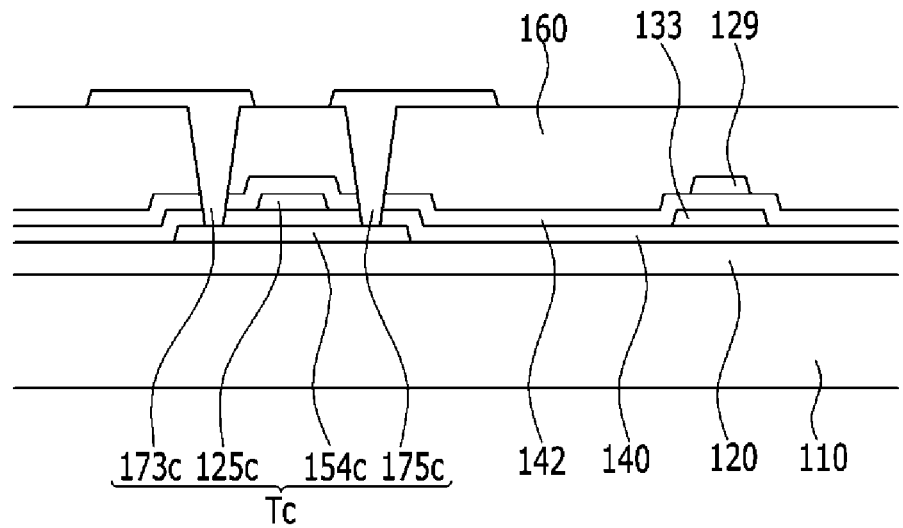
FIG. 4 is a diagram illustrating a cross section of a peripheral thin film transistor according to an exemplary embodiment.

FIG. 4 is a diagram illustrating a cross section of a peripheral thin film transistor according to an exemplary embodiment.

Referring to FIG. 4, the peripheral thin film transistor Tc includes a peripheral semiconductor layer 154c, a peripheral gate electrode 125c, a peripheral source electrode 173c, and a peripheral drain electrode 175c. The peripheral source and drain electrodes 173c and 175c face each other based on the peripheral gate electrode 125c on a plane view.

A buffer layer 120 is formed on the substrate 110 and the peripheral semiconductor layer 154c, the first gate insulating layer 140, the peripheral gate electrode 125c, and the second gate insulating layer 142 are sequentially formed on the buffer layer 120. The peripheral gate electrode 125c overlaps the peripheral semiconductor layer 154c.

The peripheral semiconductor layer 154c includes a channel region, and source and drain regions which face each other with the channel region interposed therebetween. The peripheral gate electrode 125c overlaps the channel region of the peripheral semiconductor layer 154c. Further, the peripheral gate electrode 125c may be formed the same material as the floating gate electrode 25.

The interlayer insulating layer 160 is formed on the second gate insulating layer 142 and the peripheral source electrode 173c and the peripheral drain electrode 175c are formed on the interlayer insulating layer 160. The peripheral source and drain electrodes 173c and 175c are connected to the peripheral semiconductor layer 154c. The peripheral source electrode 173c is connected to the source region of the peripheral semiconductor layer 154c and the peripheral drain electrode 175c is connected to the drain region of the peripheral semiconductor layer 154c. Further, the peripheral source and drain electrodes 173c and 175c may be formed the same material as the driving source and drain electrodes 173d and 175d.

Further, the scan driver 400 and the data driver 500 each include a capacitor adjacent to the peripheral thin film transistor.

The capacitor includes a first capacitive plate 133 and a second capacitive plate 129 formed with the second gate insulating layer 142 interposed therebetween. The first capacitive plate 133 is formed on the first gate insulating layer 140 and the second capacitive plate 129 is formed on the second gate insulating layer 142. The first and second capacitive plates 133 and 129 overlap each other.

The second gate insulating layer 142 is formed a dielectric material and the storage capacitance of the capacitor is determined based on the charge stored in the capacitor and the voltage between the first and second capacitive plates 133 and 129.

The first capacitive plate 133 may be formed of the same material as the peripheral gate electrode 125c and the second capacitive plate 129 may be formed of the same material as the driving gate electrode 125d.

According to some embodiments, each pixel of the OLED display includes six thin film transistors and two capacitors. A pixel will be described in detail with reference to FIG. 5.

Figure 5:
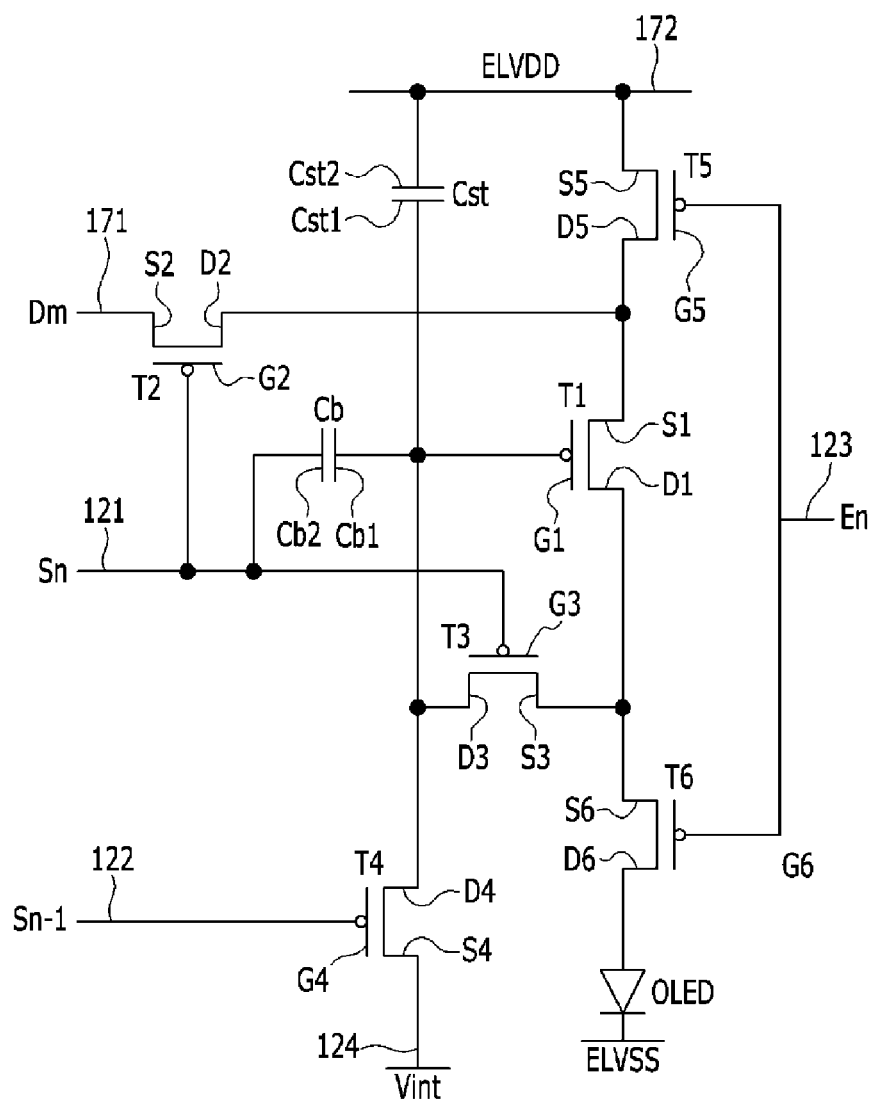
FIG. 5 is an equivalent circuit diagram for one pixel of the OLED display according to an exemplary embodiment.

FIG. 5 is an equivalent circuit diagram of a pixel of the OLED display according to an exemplary embodiment.

Referring to FIG. 5, the pixel includes a plurality of signal lines 121, 122, 123, 124, 171, and 172, a plurality of thin film transistors T1 to T6 connected to the signal lines, capacitors Cst and Cb, and an OLED.

The thin film transistors include a driving thin film transistor T1, a switching thin film transistor T2, a compensating thin film transistor T3, an initializing thin film transistor T4, and first and second emission control thin film transistors T5 and T6. The capacitors include a storage capacitor Cst and a boosting capacitor Cb.

The signal lines include a scan line 121 applying a scan signal Sn, a previous scan line 122 applying a previous scan signal Sn−1 to the initializing thin film transistor T4, and an emission control line 123 applying an emission control signal En to the first and second emission control thin film transistors T5 and T6. The signal lines also include a data line 171 applying a data signal Dm, a driving voltage line 172 applying a driving voltage ELVDD, and an initialization voltage line 124 applying an initialization voltage Vint initializing to the driving thin film transistor T1. The driving voltage line 172 is formed substantially parallel to the data line 171.

A gate electrode G1 of the driving thin film transistor T1 is connected to one end Cst1 of the storage capacitor Cst, a source electrode S1 of the driving thin film transistor T1 is connected to the driving voltage line 172 via the first emission control thin film transistor T5, and a drain electrode D1 of the driving thin film transistor T1 is electrically connected to an anode of the OLED via the second emission control thin film transistor T6. The driving thin film transistor T1 receives the data signal Dm from the switching thin film transistor T2 and applies a driving current to the OLED.

A gate electrode G2 of the switching thin film transistor T2 is connected to the scan line 121, a source electrode S2 of the switching thin film transistor T2 is connected to the data line 171, and a drain electrode D2 of the switching thin film transistor T2 is connected to the source electrode S1 of the driving thin film transistor T1 and is also connected to the driving voltage line 172 via the first emission control thin film transistor T5. The switching thin film transistor T2 is turned on in response to the scan signal Sn received through the scan line 121 to perform a switching operation. When turned on in the switching operation, the switching thin film transistor T2 applies the data signal Dm received from the data line 171 to the source electrode of the driving thin film transistor T1.

A gate electrode G3 of the compensating thin film transistor T3 is connected to the scan line 121, a source electrode S3 of the compensating thin film transistor T3 is connected to the drain electrode D1 of the driving thin film transistor T1 and an anode of the OLED, and a drain electrode D3 of the compensating thin film transistor T3 is connected to one end Cb1 of the boosting capacitor Cb and the drain electrode D4 of the initializing thin film transistor T4. The compensating thin film transistor T3 is turned on in response to the scan signal Sn received through the scan line 121 and connects the gate electrode G1 and the drain electrode D1 of the driving thin film transistor T1 to each other in order to diode-connect the driving thin film transistor T1. Accordingly, a driving current flows through the diode-connected driving thin film transistor T1.

A gate electrode G4 of the initializing thin film transistor T4 is connected to the previous scan line 122, a source electrode S4 of the initializing thin film transistor T4 is connected to the initialization voltage line 124, and a drain electrode D4 of the initializing thin film transistor T4 is connected to one end Cb1 of the boosting capacitor, one end Cst1 of the storage capacitor, the drain electrode D3 of the compensating thin film transistor T3, and the gate electrode G1 of the driving thin film transistor T1. The initializing thin film transistor T4 is turned on in response to the previous scan signal Sn−1 received through the previous scan line 122 and transfers the initialization voltage Vint to the gate electrode G1 of the driving thin film transistor T1 in order to initialize the voltage of the gate electrode G1 of the driving thin film transistor T1.

A gate electrode G5 of the first emission control thin film transistor T5 is connected to the emission control line 123, a source electrode S5 of the first emission control thin film transistor T5 is connected to the driving voltage line 172, and a drain electrode D5 of the first emission control thin film transistor T5 is connected to the source electrode S1 of the driving thin film transistor T1 and the drain electrode S2 of the switching thin film transistor T2.

A gate electrode G6 of the second emission control thin film transistor T6 is connected to the emission control line 123, a source electrode S6 of the second emission control thin film transistor T6 is connected to the drain electrode D5 of the first emission control thin film transistor T5, and a drain electrode D6 of the second emission control thin film transistor T6 is electrically connected to an anode of the OLED. The first emission control thin film transistor T5 and the second emission control thin film transistor T6 are turned on in response to the emission control signal En received through the emission control line 123 thereby transferring the driving voltage ELVDD to the OLED and controlling the driving current to flow through the OLED.

The scan line 121 connected the gate electrode G2 of the switching thin film transistor T2, the other end Cb2 of the boosting capacitor Cb. The one end Cb1 of the boosting capacitor Cb is connected to the gate electrode G1 of the driving thin film transistor T1.

The other end Cst2 of the storage capacitor Cst is connected to the driving voltage line 172 and a cathode of the OLED is connected to the common voltage ELVSS. As a result, the OLED receives the driving current from the driving thin film transistor T1 so as to emit light, thereby displaying an image.

Hereinafter, the operation of the pixel of the OLED display according to an exemplary embodiment will be described in detail.

First, the previous scan signal Sn−1 having a low level is applied through the previous scan line 122 for an initializing period. Then, the initializing thin film transistor T4 is turned on in response to the previous scan signal Sn−1 having the low level and the initialization voltage Vint is applied from the initialization voltage line 124 to the driving thin film transistor T1 through the initializing thin film transistor T4 thereby initializing the driving thin film transistor T1.

Thereafter, the scan signal Sn having a low level is applied through the scan line 121 for a data programming period. Then, the switching and compensating thin film transistors T2 and T3 are turned on in response to the scan signal Sn having the low level.

During the data programming period, the driving thin film transistor T1 is turned on to be diode-connected by the compensating thin film transistor T3. Since the driving thin film transistor T1 was initialized in the previous initializing period, the driving thin film transistor T1 is diode-connected in a forward direction. Accordingly, the data signal Dm applied from the data line 171 passes though the switching thin film transistor T2, the driving thin film transistor T1, and the compensating thin film transistor T3. As a result, a voltage corresponding to the difference between the data signal Dm and a threshold voltage Vth of the driving thin film transistor T1 is stored in the storage capacitor Cst.

Thereafter, the voltage level of the scan signal Sn is changed to a high level as the application of the scan signal Sn is stopped and the voltage applied to the gate electrode G1 of the driving thin film transistor T1 is changed in response to the voltage change of the scan signal Sn through the coupling of the boosting capacitor Cb. Since the voltage applied to the gate electrode G1 of the driving thin film transistor T1 is changed based on charge sharing between the storage capacitor Cst and the boosting capacitor Cb, the voltage change applied to the driving gate electrode G1 is proportional to the charge sharing value between the storage capacitor Cst and the boosting capacitor Cb in addition to the voltage change of the scan signal Sn.

Thereafter, the emission control signal En applied from the emission control line 123 is changed from the high level to the low level for an emission period. During the emission period, the first and second emission control thin film transistors T5 and T6 are turned on by the emission control signal En having the low level. As a result, the driving voltage ELVDD applied from the driving voltage line 172 passes through the first emission control thin film transistor T5, the driving thin film transistor T1, the second emission control thin film transistor T6, and OLED and the driving current flows to the common voltage ELVSS.

The driving current is controlled by the driving thin film transistor T1 and the driving thin film transistor T1 generates a driving current having a magnitude corresponding to the voltage applied to the gate electrode G1 of the driving thin film transistor T1. In this case, during the above described data programming period, since a voltage reflecting the threshold voltage of the driving thin film transistor T1 is stored in the storage capacitor Cst, the threshold voltage of the driving thin film transistor T1 is compensated for in the emission period.

While the described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a display substrate including a display area configured to display an image and a peripheral area surrounding the display area;
   an encapsulation substrate facing the display substrate; and
   a sealant formed in the peripheral area for bonding the display substrate to the encapsulation substrate,
   wherein the display substrate comprises:
      a substrate;
      a scan driver formed over the substrate in the peripheral area and including a common voltage line configured to apply a common voltage to the display area; and
      a pixel defining layer formed above the common voltage line,
      wherein the sealant is formed over the scan driver and directly contacts an upper surface and an entire side surface of the pixel defining layer such that a bottom surface of the sealant and a bottom surface of the pixel defining layer are coplanar, and the sealant and the pixel defining layer are insulated from the common voltage line.

2. The OLED display of claim 1, wherein the display substrate further comprises:
   a driving semiconductor layer formed over the substrate in the display area;
   a first gate insulating layer formed over i) the driving semiconductor layer and ii) the substrate in the peripheral area; and
   a floating gate electrode formed over the first gate insulating layer and formed above the driving semiconductor layer,
   wherein the common voltage line is formed on the same layer as the floating gate electrode, and
   wherein the common voltage line and the floating gate electrode are formed of the same material.

3. The OLED display of claim 2, wherein the display substrate further comprises:
   a second gate insulating layer formed over i) the floating gate electrode and ii) the first gate insulating layer;
   a driving gate electrode formed over the second gate insulating layer and formed above the floating gate electrode; and
   a common voltage connection line formed over the second gate insulating layer in the peripheral area and connected to the common voltage line.

4. The OLED display of claim 3, wherein the common voltage connection line and the driving gate electrode are formed of the same material.

5. The OLED display of claim 4, wherein the display substrate further comprises:
   an interlayer insulating layer formed over i) the driving gate electrode, ii) the common voltage connection line, and iii) the second gate insulating layer;
   a driving source electrode and a driving drain electrode formed over the interlayer insulating layer in the display area; and
   a first common voltage applying electrode formed on the interlayer insulating layer in the peripheral area and connected to the common voltage connection line.

6. The OLED display of claim 5, wherein the first common voltage applying electrode, the driving source electrode, and the driving drain electrode are formed of the same material.

7. The OLED display of claim 6, wherein the display substrate further comprises:
   a passivation layer formed over i) the driving source electrode, ii) the driving drain electrode, and iii) the first common voltage applying electrode;
   a first electrode formed over the passivation layer in the display area and connected to the driving drain electrode; and
   a second common voltage applying electrode formed over the passivation layer in the peripheral area and connected to the first common voltage applying electrode.

8. The OLED display of claim 7, wherein the second common voltage applying electrode and the first electrode are formed of the same material.

9. The OLED display of claim 8, wherein the passivation layer is formed above the common voltage line.

10. The OLED display of claim 9, wherein the pixel defining layer is formed over i) the passivation layer and ii) edges of the first electrode, wherein the pixel defining layer has a plurality of openings formed above the first electrode, and wherein the display substrate further comprises i) an organic emission layer formed over the first electrode in the openings of the passivation layer and ii) a second electrode formed over the organic emission layer and the pixel defining layer.

11. The OLED display of claim 10, wherein the pixel defining layer is formed over the passivation layer in the peripheral area and contacts the interlayer insulating layer in the peripheral area.

12. The OLED display of claim 11, wherein the second electrode is connected to the second common voltage applying electrode and is configured to receive the common voltage from the second common voltage applying electrode.

13. The OLED display of claim 12, wherein the second gate insulating layer has a common voltage connection hole above the common voltage line and wherein the common voltage connection line is connected to the common voltage line through the common voltage connection hole.

14. The OLED display of claim 12, wherein the interlayer insulating layer has a first common voltage applying hole above the common voltage connection line and wherein the first common voltage applying electrode is connected to the common voltage connection line through the first common voltage applying hole.

15. The OLED display of claim 12, wherein the passivation layer has a second common voltage applying hole above the first common voltage applying electrode and wherein the second common voltage applying electrode is connected to the first common voltage applying electrode through the second common voltage applying hole.

16. The OLED display of claim 12, wherein the pixel defining layer has a third common voltage applying hole formed above the second common voltage applying electrode and wherein the second electrode is connected to the second common voltage applying electrode through the third common voltage applying hole.

17. The OLED display of claim 12, wherein the pixel defining layer has a width greater than that of the common voltage line and wherein the width is measured in a direction substantially parallel with the display substrate.

* * * * *